(12) United States Patent
Kayal et al.

(10) Patent No.: US 9,238,340 B2
(45) Date of Patent: Jan. 19, 2016

(54) PROCESSES FOR THE PRODUCTION OF ELECTRO-OPTIC DISPLAYS

(71) Applicant: E INK CORPORATION, Cambridge, MA (US)

(72) Inventors: Matthew Joseph Kayal, Franklin, MA (US); Stephen Joseph Battista, Dorchester, MA (US); Richard J. Paolini, Jr., Framingham, MA (US); Shyamala A. Subramanian, Jr., Arlington, MA (US)

(73) Assignee: E Ink Corporation, Billerica, MA (US)

( * ) Notice: Subject to any disclaimer, the term of this patent is extended or adjusted under 35 U.S.C. 154(b) by 161 days.

(21) Appl. No.: 13/951,511

(22) Filed: Jul. 26, 2013

(65) Prior Publication Data

US 2014/0027044 A1    Jan. 30, 2014

Related U.S. Application Data

(60) Provisional application No. 61/676,356, filed on Jul. 27, 2012.

(51) Int. Cl.
  *H05K 3/22* (2006.01)
  *B29D 11/00* (2006.01)
  (Continued)

(52) U.S. Cl.
  CPC ............ *B29D 11/0073* (2013.01); *C09D 11/52* (2013.01); *H05K 3/321* (2013.01); *H05K 3/4084* (2013.01); *B32B 37/12* (2013.01); *B32B 38/0004* (2013.01); *B32B 38/04* (2013.01); *B32B 2307/202* (2013.01); *B32B 2307/412* (2013.01); *B32B 2310/0843* (2013.01); *B32B 2457/20* (2013.01); *G02F 1/133377* (2013.01); *G02F 1/167* (2013.01); *G02F 2201/42* (2013.01); *G02F 2202/16* (2013.01); *G02F 2202/28* (2013.01); *H05K 2201/091* (2013.01); *H05K 2203/0455* (2013.01)

(58) Field of Classification Search
  CPC ... B29D 11/0073; H05K 3/321; H05K 3/4084
  USPC ......................... 156/256, 250, 145
  See application file for complete search history.

(56) References Cited

U.S. PATENT DOCUMENTS 3,037,265 A * 6/1962 Kollmeier ...................... 29/849
4,418,346 A   11/1983 Batchelder
(Continued)

OTHER PUBLICATIONS

Kitarnura, T., et al., "Electrical toner movement for electronic paper-like display", Asia Display/IDW '01, p. 1517, Paper HCS1-1 (2001) Dec. 31, 2001.

(Continued)

*Primary Examiner* — Jeff Aftergut
(74) *Attorney, Agent, or Firm* — David J. Cole

(57) ABSTRACT

Electrical connection between the backplane and the front electrode of an electro-optic display is provided by forming a front plane laminate (100) comprising, in order, a light-transmissive electrically-conductive layer (104), a layer of electro-optic material (106), and a layer of lamination adhesive (108); forming an aperture (114) through all three layers of the front plane laminate (100); and introducing a flowable, electrically-conductive material (118) into the aperture (114), the flowable, electrically-conductive material being in electrical contact with the light-transmissive electrically-conductive layer (104) and extending through the adhesive layer (108).

15 Claims, 1 Drawing Sheet

(51) Int. Cl.
*C09D 11/52* (2014.01)
*H05K 3/32* (2006.01)
*H05K 3/40* (2006.01)
*B32B 37/12* (2006.01)
*B32B 38/00* (2006.01)
*B32B 38/04* (2006.01)
*G02F 1/1333* (2006.01)
*G02F 1/167* (2006.01)

(56) References Cited

U.S. PATENT DOCUMENTS

| | | | |
|---|---|---|---|
| 5,131,141 A * | 7/1992 | Kawaguchi | 29/853 |
| 5,760,761 A | 6/1998 | Sheridon | |
| 5,808,783 A | 9/1998 | Crowley | |
| 5,872,552 A | 2/1999 | Gordon, II et al. | |
| 6,054,071 A | 4/2000 | Mikkelsen, Jr. | |
| 6,055,091 A | 4/2000 | Sheridon et al. | |
| 6,097,531 A | 8/2000 | Sheridon | |
| 6,128,124 A | 10/2000 | Silverman | |
| 6,130,774 A | 10/2000 | Albert et al. | |
| 6,137,467 A | 10/2000 | Sheridon et al. | |
| 6,144,361 A | 11/2000 | Gordon, II et al. | |
| 6,147,791 A | 11/2000 | Sheridon | |
| 6,172,798 B1 | 1/2001 | Albert et al. | |
| 6,184,856 B1 | 2/2001 | Gordon, II et al. | |
| 6,225,971 B1 | 5/2001 | Gordon, II et al. | |
| 6,241,921 B1 | 6/2001 | Jacobson et al. | |
| 6,271,823 B1 | 8/2001 | Gordon, II et al. | |
| 6,301,038 B1 | 10/2001 | Fitzmaurice et al. | |
| 6,672,921 B1 | 1/2004 | Liang et al. | |
| 6,788,449 B2 | 9/2004 | Liang et al. | |
| 6,825,829 B1 | 11/2004 | Albert et al. | |
| 6,866,760 B2 | 3/2005 | Paolini Jr. et al. | |
| 6,870,657 B1 | 3/2005 | Fitzmaurice et al. | |
| 6,922,276 B2 | 7/2005 | Zhang et al. | |
| 6,950,220 B2 | 9/2005 | Abramson et al. | |
| 6,982,178 B2 * | 1/2006 | LeCain et al. | 438/22 |
| 7,002,728 B2 | 2/2006 | Pullen et al. | |
| 7,012,600 B2 | 3/2006 | Zehner et al. | |
| 7,075,502 B1 | 7/2006 | Drzaic et al. | |
| 7,116,318 B2 | 10/2006 | Amundson et al. | |
| 7,170,670 B2 | 1/2007 | Webber | |
| 7,236,291 B2 | 6/2007 | Kaga et al. | |
| 7,236,292 B2 | 6/2007 | LeCain et al. | |
| 7,312,784 B2 | 12/2007 | Baucom et al. | |
| 7,321,459 B2 | 1/2008 | Masuda et al. | |
| 7,339,715 B2 | 3/2008 | Webber et al. | |
| 7,411,719 B2 | 8/2008 | Paolini, Jr. et al. | |
| 7,420,549 B2 | 9/2008 | Jacobson et al. | |
| 7,443,571 B2 | 10/2008 | LeCain et al. | |
| 7,453,445 B2 | 11/2008 | Amundson | |
| 7,513,813 B2 | 4/2009 | Paolini, Jr. et al. | |
| 7,535,624 B2 | 5/2009 | Amundson et al. | |
| 7,561,324 B2 | 7/2009 | Duthaler et al. | |
| 7,583,427 B2 | 9/2009 | Danner et al. | |
| 7,636,191 B2 | 12/2009 | Duthaler | |
| 7,649,666 B2 | 1/2010 | Isobe et al. | |
| 7,679,814 B2 | 3/2010 | Paolini, Jr. et al. | |
| 7,728,811 B2 | 6/2010 | Albert et al. | |
| 7,729,039 B2 | 6/2010 | LeCain et al. | |
| 7,733,554 B2 | 6/2010 | Danner et al. | |
| 7,791,782 B2 | 9/2010 | Paolini, Jr. et al. | |
| 7,826,129 B2 | 11/2010 | Wu et al. | |
| 7,839,564 B2 | 11/2010 | Whitesides et al. | |
| 7,843,621 B2 | 11/2010 | Danner et al. | |
| 7,843,624 B2 | 11/2010 | Danner et al. | |
| 7,910,175 B2 | 3/2011 | Webber et al. | |
| 8,009,348 B2 | 8/2011 | Zehner et al. | |
| 8,034,209 B2 | 10/2011 | Danner et al. | |
| 8,068,272 B2 | 11/2011 | LeCain et al. | |
| 8,077,381 B2 | 12/2011 | LeCain et al. | |
| 8,177,942 B2 | 5/2012 | Paolini, Jr. et al. | |
| 8,319,759 B2 | 11/2012 | Jacobson et al. | |
| 8,390,301 B2 | 3/2013 | Danner et al. | |
| 8,482,835 B2 | 7/2013 | LeCain et al. | |
| 8,754,859 B2 | 6/2014 | Gates et al. | |
| 8,786,929 B2 | 7/2014 | LeCain et al. | |
| 2007/0211331 A1 | 9/2007 | Danner et al. | |
| 2010/0225995 A1 | 9/2010 | Paolini, Jr. et al. | |
| 2011/0032595 A1 | 2/2011 | Whitesides et al. | |
| 2011/0140744 A1 | 6/2011 | Kazlas et al. | |
| 2011/0164301 A1 | 7/2011 | Paolini, Jr. et al. | |
| 2012/0176664 A1 | 7/2012 | Patry et al. | |
| 2012/0293858 A1 | 11/2012 | Telfer et al. | |

OTHER PUBLICATIONS

Yamaguchi, Y., et al., "Toner display using insuiatiye particles charged triboeiectrically", Asia Display/IDW'01, p. 1729, Paper AMD4-4 (2001) Dec. 31, 2001.

Hayes, R.A., et al., "Video-Speed Electronic Paper Based on Electrowetting", Nature, vol. 425, Sep. 25, pp. 383-385 (2003) Sep. 25, 2003.

International Search Report and Written Opinion for PCTIUS20131052037 Nov. 1, 2013.

* cited by examiner

PROCESSES FOR THE PRODUCTION OF ELECTRO-OPTIC DISPLAYS

REFERENCE TO RELATED APPLICATIONS

This application claims benefit of Application Ser. No. 61/676,356, filed Jul. 27, 2013.

This application is also related to:

(a) U.S. Pat. Nos. 6,982,178; 7,236.292; 7,443,571; 7,729,039; 8,068,272; and 8,077,381;
(b) U.S. Pat. No. 7,733,554;
(c) U.S. Pat. No. 7,910,175;
(d) U.S. Pat. No. 7,583,427; and
(e) U.S. Pat. Nos. 7,843,624; 8,034,209; and 8,390,301.

The entire contents of these patents, and of all other U.S. patents and published and copending applications mentioned below, are herein incorporated by reference.

BACKGROUND OF INVENTION

This invention relates to processes for the production of electro-optic displays. This invention is particularly, but not exclusively, intended for use with displays comprising encapsulated electrophoretic media. However, the invention can also make use of various other types of electro-optic media which can be incorporated into a mechanically coherent multi-layer film, such as encapsulated liquid crystal displays and other types of electro-optic displays discussed below.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in the these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276; and 7,411,719;

(c) Films and sub-assemblies containing electro-optic materials; see for example U.S. Pat. Nos. 6,825,829; 6,982,178; 7,236,292; 7,443,571; 7,513,813; 7,561,324; 7,636,191; 7,649,666; 7,728,811; 7,729,039; 7,791,782; 7,839,564; 7,843,621; 7,843,624; 8,034,209; 8,068,272; 8,077,381; and 8,177,942; and U.S. Patent Applications Publication Nos. 2008/0309350; 2009/0034057; 2009/0109519; 2009/0168067; 2011/0032595; 2011/0032396; 2011/0075248; 2011/0164301; and 2012/0176664;

(d) Backplanes, adhesive layers and other auxiliary layers and methods used in displays; see for example U.S. Pat. Nos. 7,116,318; and 7,535,624;

(e) Color formation and color adjustment; see for example U.S. Pat. No. 7,075,502; and U.S. Patent Application Publication No. 2007/0109219;

(f) Methods for driving displays; see for example U.S. Pat. Nos. 7,012,600; and 7,453,445;

(g) Applications of displays; see for example U.S. Pat. Nos. 7,312,784; and 8,009,348; and (h) Non-electrophoretic displays, as described in U.S. Pat. Nos. 6,241,921; 6,950,220; 7,420,549 and 8,319,759; and U.S. Patent Application Publication No. 2012/0293858.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic materials may also be used in the present invention.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

The manufacture of a three-layer electrophoretic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display usable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive.

As discussed in the aforementioned U.S. Pat. No. 6,982, 178, many of the components used in solid electro-optic displays, and the methods used to manufacture such displays, are derived from technology used in liquid crystal displays (LCD's), which are of course also electro-optic displays, though using a liquid rather than a solid medium. For example, solid electro-optic displays may make use of an active matrix backplane comprising an array of transistors or diodes and a corresponding array of pixel electrodes, and a "continuous" front electrode (in the sense of an electrode which extends over multiple pixels and typically the whole display) on a transparent substrate, these components being essentially the same as in LCD's. However, the methods used for assembling LCD's cannot be used with solid electro-optic displays. LCD's are normally assembled by forming the backplane and front electrode on separate glass substrates, then adhesively securing these components together leaving a small aperture between them, placing the resultant assembly under vacuum, and immersing the assembly in a bath of the liquid crystal, so that the liquid crystal flows through the aperture between the backplane and the front electrode. Finally, with the liquid crystal in place, the aperture is sealed to provide the final display.

This LCD assembly process cannot readily be transferred to solid electro-optic displays. Because the electro-optic material is solid, it must be present between the backplane and the front electrode before these two integers are secured to each other. Furthermore, in contrast to a liquid crystal material, which is simply placed between the front electrode and the backplane without being attached to either, a solid electro-optic medium normally needs to be secured to both; in most cases the solid electro-optic medium is formed on the front electrode, since this is generally easier than forming the medium on the circuitry-containing backplane, and the front electrode/electro-optic medium combination is then laminated to the backplane, typically by covering the entire surface of the electro-optic medium with an adhesive and laminating under heat, pressure and possibly vacuum.

Electro-optic displays are often costly; for example, the cost of the color LCD found in a portable computer is typically a substantial fraction of the entire cost of the computer. As the use of electro-optic displays spreads to devices, such as cellular telephones and personal digital assistants (PDA's), much less costly than portable computers, there is great pressure to reduce the costs of such displays. The ability to form layers of some solid electro-optic media by printing techniques on flexible substrates, as discussed above, opens up the possibility of reducing the cost of electro-optic components of displays by using mass production techniques such as roll-to-roll coating using commercial equipment used for the production of coated papers, polymeric films and similar media. However, such equipment is costly and the areas of electro-optic media presently sold may be insufficient to justify dedicated equipment, so that it may typically be necessary to transport the coated medium from a commercial coating plant to the plant used for final assembly of electro-optic displays without damage to the relatively fragile layer of electro-optic medium.

The aforementioned U.S. Pat. No. 6,982,178 describes a method of assembling a solid electro-optic display (including a particle-based electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will be normally be viewed through the electrically-conductive layer and adjacent substrate (if present). The substrate will be typically be a polymeric film, and will normally have a thickness in the range of about 1 to about 25 mil (25 to 634 μm), preferably about 2 to about 10 mil (51 to 254 μm). The electrically-conductive layer is conveniently a thin metal layer of, for example, aluminum or ITO, or may be a conductive polymer. Poly(ethylene terephthalate) (PET) films coated with aluminum or ITO are available commercially, for example as "aluminized Mylar" ("Mylar" is a Registered Trade Mark) from E.I. du Pont de Nemours & Company, Wilmington Del., and such commercial materials may be used with good results in the front plane laminate.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well-adapted to mass production since the front plane laminate may be mass produced, typically using roll-to-roll coating techniques, and then cut into pieces of any size needed for use with specific backplanes.

The aforementioned U.S. Pat. No. 6,982,178 also describes a method for testing the electro-optic medium in a front plane laminate prior to incorporation of the front plane laminate into a display. In this testing method, the release sheet is provided with an electrically conductive layer, and a voltage sufficient to change the optical state of the electro-optic medium is applied between this electrically conductive layer and the electrically conductive layer on the opposed side of the electro-optic medium. Observation of the electro-optic medium will then reveal any faults in the medium, thus avoiding laminating faulty electro-optic medium into a display, with the resultant cost of scrapping the entire display, not merely the faulty front plane laminate.

The aforementioned U.S. Pat. No. 6,982,178 also describes a second method for testing the electro-optic medium in a front plane laminate by placing an electrostatic charge on the release sheet, thus forming an image on the electro-optic medium. This image is then observed in the same way as before to detect any faults in the electro-optic medium.

The aforementioned U.S. Pat. No. 7,561,324 describes a so-called "double release film" which is essentially a simplified version of the front plane laminate of the aforementioned U.S. Pat. No. 6,982,178. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release film are intended for use in a process generally similar to the process for assembling an electro-optic display from a front plane laminate already described, but involving two separate laminations; typically, in a first lamination the double release sheet is laminated to a front electrode to form a front sub-assembly, and then in a second lamination the front sub-assembly is laminated to a backplane to form the final display, although the order of these two laminations could be reversed if desired.

The aforementioned U.S. Pat. No. 7,839,564 describes a so-called "inverted front plane laminate", which is a variant of the front plane laminate described in the aforementioned U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode or front substrate; a second, typically thin layer of adhesive may or may not be present between the electro-optic layer and a backplane. Such electro-optic displays can combine good resolution with good low temperature performance.

The aforementioned U.S. Pat. No. 7,839,564 also describes various methods designed for high volume manufacture of electro-optic displays using inverted front plane laminates; preferred forms of these methods are "multi-up" methods designed to allow lamination of components for a plurality of electro-optic displays at one time.

The aforementioned U.S. Pat. No. 6,982,178 also describes methods for forming an electrical connection between a backplane to which the front plane laminate is laminated and the light-transmissive electrically-conductive layer within the front plane laminate. As illustrated in FIGS. 21 and 22 of this patent, the formation of the layer of electro-optic medium within the front plane laminate may be controlled so as to leave uncoated areas ("gutters") where no electro-optic medium is present, and portions of these uncoated areas can later serve to form the necessary electrical connections. However, this method of forming connections tends to be undesirable from a manufacturing point of view, since the placement of the connections is of course a function of the backplane design, so that FPL coated with a specific arrangement of gutters can only be used with one, or a limited range of backplanes, whereas for economic reasons it is desirable to produce only one form of FPL which can be used with any backplane.

Accordingly, the aforementioned U.S. Pat. No. 6,982,178 also describes methods for forming the necessary electrical connections by coating electro-optic medium over the whole area of the FPL and then removing the electro-optic medium where it is desired to form electrical connections. However, such removal of electro-optic medium poses its own problems. Typically, the electro-optic medium must be removed by the use of solvents or mechanical cleaning, either of which may result in damage to, or removal of, the electrically-conductive layer of the FPL (this electrically-conductive layer usually being a layer of a metal oxide, for example indium tin oxide, less than 1 μm thick), causing a failed electrical connection. In extreme cases, damage may also be caused to the front substrate (typically a polymeric film) which is used to support and mechanically protect the conductive layer. In some cases, the materials from which the electro-optic medium is formed may not be easily solvated, and it may not be possible to remove them without the use of aggressive solvents and/or high mechanical pressures, either of which will exacerbate the aforementioned problems.

Similar methods using selective coating of electro-optic medium and/or selective removal of electro-optic medium may also be applied to the double release films and inverted front plane laminates discussed above.

It is common practice to use laser cutting to separate from a continuous web of FPL pieces of appropriate sizes for lamination to individual backplanes. Such laser cutting can also be used to prepare areas for electrical connections to the backplane by "kiss cutting" the FPL with the laser from the lamination adhesive side so that the lamination adhesive and electro-optic medium are removed from the connection areas, but the electrically-conductive layer is not removed. Such kiss cutting requires accurate control of both laser power and cutting speed if the thin and relatively fragile electrically-conductive layer is not to be removed or damaged. Furthermore, following the kiss cutting it is normally necessary to mechanically or chemically remove ("clean") the residue of the electro-optic and/or adhesive layers from the electrically-conductive layer in order to enable good electrical contact to be made with this layer. Also, depending upon the location of the connection, bending of the electrically-conductive layer and the associated front substrate may crack the conductive layer, resulting in failure to make a proper connection between the backplane and the conductive layer, and hence display failure. In practice, it is necessary to inspect each FPL piece after the cleaning step is completed and before the FPL piece is laminated to a backplane. Just prior to the FPL/backplane lamination, a small quantity of a conductive adhesive or ink is placed on the backplane at the points where the front electrode connections will be made. Following the lamination, the conductive adhesive or ink electrically connects the front electrode to the backplane. Typically, a protective sheet is them laminated over the viewing surface of the display, followed by an edge sealing operation to produce the final display module. This process poses scalability, yield and cost concerns when used for mass production of displays.

The aforementioned U.S. Pat. No. 7,733,554 describes two processes for providing electrical connections between a front electrode and a backplane without kiss cutting. In the first, so-called "pre-formed connection aperture" or "PFCA" process, a sub-assembly is first formed comprising a layer of lamination adhesive and a layer of electro-optic medium, An aperture is cut through this sub-assembly, and then there is secured to the exposed surface of the layer of lamination adhesive a light-transmissive electrode layer, the electrode layer extending across the aperture. The second, so-called "extended tab" process, starts with formation of the same sub-assembly comprising a layer of lamination adhesive and a layer of electro-optic medium. However, in the extended tab process, no aperture is formed through the sub-assembly; instead, a light-transmissive electrode layer is secured to the exposed surface of the lamination adhesive layer of the sub-assembly, the electrode layer having a tab portion which extends beyond the periphery of the layers of lamination adhesive and electro-optic medium. Although these two processes do avoid the need for kiss cutting a front plane laminate, they suffer from other practical disadvantages when used on a production scale. Both processes require that the location of the front electrode connections (via the apertures or the tabs) be known before the front electrode is secured to the electro-optic layer; neither process permits large scale manufacture (typically by a roll-to-roll process) of a front plane laminate in a manner which permits to front laminate to be modified to produce a variety of displays of different sizes, and thus requiring different front plane connections.

Accordingly, there is thus a need for improved methods of forming electrical connections to the conductive layers of front plane laminates, and the present invention seeks to provide such improved methods.

SUMMARY OF INVENTION

Accordingly, this invention provides a modification of the kiss cutting process described above. The process of the present invention renders a kiss cut unnecessary; instead a cut is made completely through the FPL to form an aperture, and a flowable conductive material is thereafter placed in the aperture to provide contact between the backplane and the conductive layer of the FPL.

Accordingly, the present invention provides a process for the production of an electro-optic display, the process comprising:

forming a front plane laminate comprising, in order, a light-transmissive electrically-conductive layer, a layer of electro-optic material, and a layer of lamination adhesive;

forming an aperture through all three layers of the front plane laminate; and introducing a flowable, electrically-conductive material into the aperture, the flowable, electrically-conductive material being in electrical contact with the light-transmissive electrically-conductive layer and extending through the adhesive layer.

The process of the present invention may hereinafter for convenience be called the "through cut" process of the invention.

The term "light-transmissive electrically-conductive layer" is used herein in the same sense as in the aforementioned U.S. Pat. No. 6,982,178. This layer should be sufficiently light-transmissive that a user, viewing the display through the light-transmissive electrically-conductive layer can see the changes in the electro-optic properties of the electro-optic layer as the electro-optic layer is switched.

In the process of the present invention, the front plane laminate may comprise a release sheet covering the surface of the layer of lamination adhesive remote from the layer of electro-optic material. The aperture may or may not extend through such a release sheet, but it is usually most convenient for the aperture to extend through the release sheet, so that all layers of the front plane laminate can be cut in the same operation. As discussed in the aforementioned U.S. Pat. No. 6,982,178, the release sheet may comprise a conductive layer, which can be used for testing the electro-optic layer in the manner already described. The light-transmissive electrically-conductive layer may be carried on a support layer; typically, the electrically-conductive layer is part of a front substrate which comprises in addition to the electrically-conductive layer, a support layer, typically a polymeric film, which provides mechanical support and protection for what is normally a relatively fragile electrode layer. The front plane laminate may comprise two layers of lamination adhesive on opposed sides of the layer of electro-optic medium, and in such a front plane laminate the aperture will extend through both layers of lamination adhesive.

The formation of the aperture in the process of the present invention will typically be effected by laser cutting, and, for reasons discussed in more detail below, will normally be effected from the adhesive layer side of the front plane laminate The aperture-containing front plane laminate produced in the present process may be used in a manner exactly similar to aperture-containing FPL's produced by mechanical or solvent removal of electro-optic medium and lamination adhesive, as described in the aforementioned U.S. Pat. No. 6,982,178. Thus, after removal of the release sheet (if present) the lamination adhesive may be laminated to a backplane comprising at least one electrode, with the flowable conductive material being introduced into the aperture prior to or during this lamination so as to provide an electrical connection between the light-transmissive electrically-conductive layer and a contact provided on the backplane.

DETAILED DESCRIPTION

As indicated above, the present invention provides a process for the production of an electro-optic display. This process starts from a front plane laminate comprising, in order, a light-transmissive electrically-conductive layer, a layer of electro-optic material, and a layer of lamination adhesive. An aperture is formed through all three layers of the front plane laminate; and a flowable, electrically-conductive material, such as a conductive adhesive or conductive ink, is introduced into the aperture, so that the flowable material is in electrical contact with the light-transmissive electrically-conductive layer and extends through the adhesive layer.

A preferred process of the present invention will now be described in more detail, though by way of illustration only, with reference to the accompanying drawings, which are schematic sections through a front plane laminate ("FPL"—generally designated 100) at two different stage of the process. The accompanying drawings are not to scale; in particular the thicknesses of the various layer illustrated are varied for ease of illustration.

Figure 1:
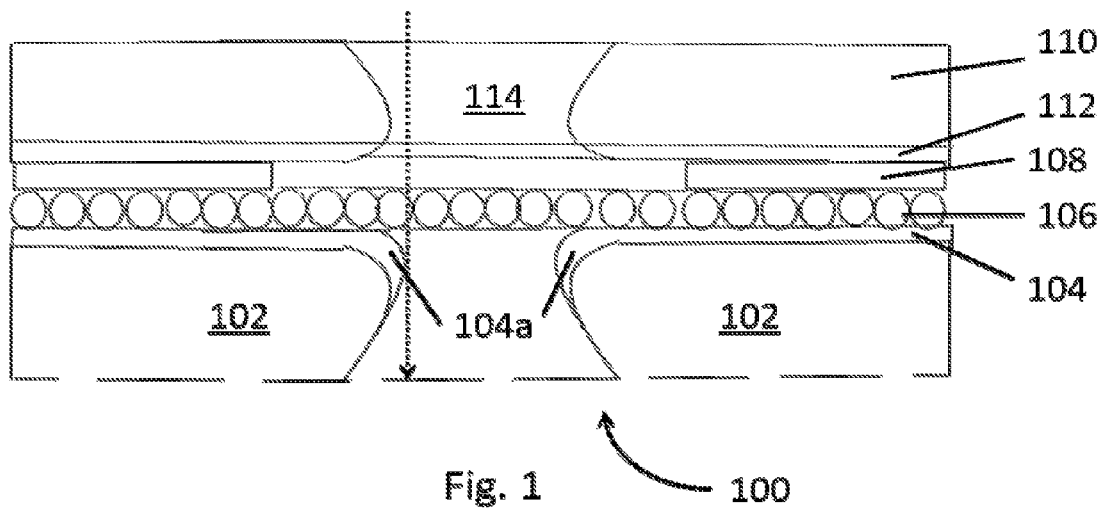
FIG. 1 of the accompanying drawings is a schematic cross-section through a front plane laminate used in the process of the present invention after formation of an aperture through this front plane laminate.

As already mentioned, FIG. 1 of the accompanying drawings is a schematic cross-section through the front plane laminate 100 after formation of an aperture therethrough. The FPL 100 comprises a transparent front substrate 102, formed from a poly(ethylene terephthalate) (PET) film, a light-transmissive, electrically-conductive layer 104, which may be formed from indium tin oxide (ITO) or a conductive polymer, a layer of electro-optic material 106 (illustrated as an encapsulated electrophoretic layer), an adhesive layer 108 and a release sheet 110 provided, on its surface facing the adhesive layer 108, with a conductive layer 112, which may conveniently be a thin layer of aluminum. As illustrated in FIG. 1, an aperture 114 has been cut through all the layers of the FPL by means of a laser cutter directed at the FPL from the release sheet side (i.e., downwardly as illustrated by the arrow in FIG. 1).

As may be seen in FIG. 1, an observer looking downwardly through the aperture 114 through the FPL 100 will seen areas 104a of the electrically-conductive layer 104 exposed near the bottom of the aperture 114. The aperture cutting process exposes the electrically-conductive layer 104 electrode in two ways: 1) during the laser cutting process the PET/ITO film used to form the layers 102 and 104 melts, vaporizes and shrinks, thus enlarging the aperture; as the PET shrinks or burns back, the ITO layer 104 is pulled up into the cylinder formed by the cutting process, in a manner similar to that by which a plated via is formed during printed circuit board construction; and 2) the electro-optic 106 and lamination adhesive 108 layers are burned back more than the PET/ITO, thus exposing additional ITO layer 104.

Figure 2:
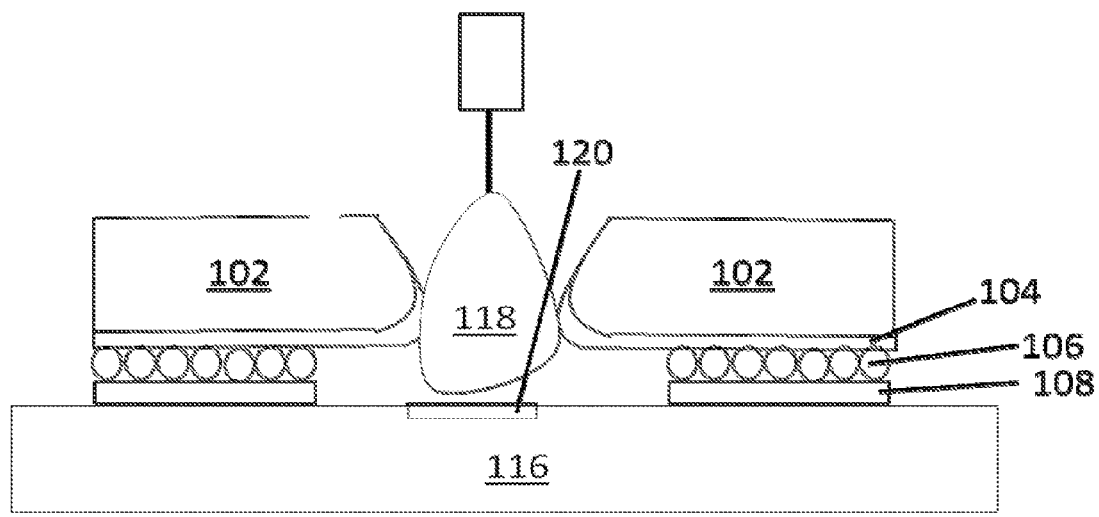
FIG. 2 shows the front plane laminate shown in FIG. 1 being laminated to a backplane

FIG. 2 shows the FPL 100 shown in FIG. 1 being laminated to a backplane 116. (Please note that the FPL in FIG. 2 is inverted relative to its position in FIG. 1.) The FPL first has the release sheet 110 and its attached conductive layer 112 removed. The FPL is then placed adjacent the backplane 116 with the adhesive layer 108 in contact with the backplane, and a flowable conductive material 118, preferably a conductive adhesive, is dispensed into the aperture in the FPL. The flowable conductive material forms a conductive via extending through the aperture in the FPL and establishing electrical contact between the conductive layer 104 and an electrode 120 provided on the backplane 116. The FPL and the backplane 116 are then typically passed through a laminator (not shown) and laminated together under heat and pressure. Following this lamination, a protective sheet may be laminated over the FPL and the edges sealed, for example in any of the ways described in the aforementioned U.S. Pat. No. 6,982,178.

When using the process of the present invention, inspection of the front plane laminate can take place while the FPL is still in the form of large sheets or rolls, in such a way that the subsequently cut FPL is identifiable as fit for use. Typically, this task is performed using a grid overlay to identify individual FPL within a larger sheet or roll. The desired shape of FPL for a display may be is formed the usual way with a laser cutter.

The present invention may allow elimination of the prior art requirement for piece part inspection, kiss cutting, release sheet removal and cleaning of electro-optic and adhesive layers of the FPL during for display manufacture. These process steps could be are replaced by inspection of large sheets or rolls, formation of apertures for front electrode connections at the same time that individual pieces of FPL are cut for displays. This could increase throughput and decrease yield loss associated with cleaning and laser kiss cutting. Additionally, the process of the present invention should result in manufacturing processing cost and tact time reduction.

This invention may allow for a reduction in size of the FPL tab currently used for creating a top plane connection; see for example the aforementioned U.S. Pat. No. 8,034,209. Currently, one limitation on the top plane connection size is the need for mechanical cleaning by technicians. Using the laser to create patterns at the connection site could greatly increase the amount of exposed conductive layer for a given cut area. For example, cutting a series of tightly grouped parallel lines in a 1 mm square offers greater conductive layer exposure than a circular hole of equal area. The pattern density is a function of the laser beam focus, mechanical tolerance of the machine and the melt characteristics of the front substrate used to support the conductive layer.

The amount of conductive layer exposed is easily adjustable and can take on any shape the laser is capable of cutting, this may be a useful feature as the amount of electrode contact required changes with display size.

Another technical advantage of this invention is that it may allow the use of alternative electrode materials that are not top plane cleanable using the current chemical and mechanical methods. Some alternative electrode materials are very sensitive to the current cleaning process, for example poly-3,4-ethylenedioxythiophene (PEDOT), a conductive polymer which can be used as the conductive layer, is easily damaged by mechanical scrubbing and use of solvents.

The electrode arrangements in the displays produced using the process of the present invention can be of any of the types described in the aforementioned E Ink and MIT patents and applications. Thus, for example, the displays may be of the direct drive type, in which the backplane is provided with a plurality of electrodes, each of which is provided with a separate connector by means of which a controller can control the voltage applied to the specific electrode. In such a direct drive display, a single continuous front electrode is usually provided covering the whole display, although other front electrode arrangements are possible. Depending upon the type of electro-optic material used, it may be possible to use a passive matrix drive arrangement in which (typically) the backplane carries a plurality of elongate parallel electrodes ("column electrodes"), while on the opposed side of the electro-optic material there is provided a plurality of elongate parallel electrodes ("row electrodes") running at right angles to the column electrodes, the overlap between one specific column electrode and one specific row electrode defining one pixel of the display. The present displays may also be of the active matrix type, typically with a single continuous front electrode covering the whole display and a matrix of pixel electrodes on the backplane, each pixel electrode defining one pixel of the display and having an associated transistor or other non-linear element, the active matrix display being scanned in the conventional manner to write the display in a row-by-row fashion. Finally, the present display may also be of the stylus-driven type, with (typically) a single electrode on the backplane and no permanent front electrode, writing of the display being effected by moving a stylus across the front surface of the display.

The process of the present invention may make use of any of the types of electro-optic material discussed above. Thus, for example, the electro-optic material in the front plane laminate may comprise a rotating bichromal member, electrochromic or electro-wetting material. Alternatively, the electro-optic material may comprise an electrophoretic material comprising a plurality of electrically charged particles disposed in a fluid and capable of moving through the fluid under the influence of an electric field. The electrically charged particles and the fluid may be confined within a plurality of capsules or microcells, or may be present as a plurality of discrete droplets surrounded by a continuous phase comprising a polymeric material. The fluid may be liquid or gaseous.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. A process for the production of an electro-optic display, the process comprising:
    forming a front plane laminate comprising, in order, a light-transmissive electrically-conductive layer, a layer of electro-optic material, and a layer of lamination adhesive;
    forming an aperture through all three layers of the front plane laminate; and
    introducing a flowable, electrically-conductive material into the aperture, the flowable, electrically-conductive material being in electrical contact with the light-transmissive electrically-conductive layer and extending through the adhesive layer.

2. A process according to claim 1 wherein the front plane laminate comprises a release sheet covering the surface of the layer of lamination adhesive remote from the layer of electro-optic material.

3. A process according to claim 2 wherein the release sheet comprises a conductive layer.

4. A process according to claim 2 wherein the aperture extends through the release sheet.

5. A process according to claim 1 wherein the front plane laminate comprises two layers of lamination adhesive on opposed sides of the layer of electro-optic medium, and the aperture extends through both layers of lamination adhesive.

6. A process according to claim 1 wherein the formation of the aperture is effected by laser cutting.

7. A process according to claim 6 wherein the laser cutting is effected from the adhesive layer side of the front plane laminate.

8. A process according to claim 1 wherein the electrically-conductive material comprises a conductive adhesive or a conductive ink.

9. A process according to claim 2 further comprising removing the release sheet from the front plane laminate; and
laminating the remaining layers of the front plane laminate to a backplane comprising at least one electrode,
wherein the flowable conductive material is introduced into the aperture prior to or during the lamination so as to provide an electrical connection between the light-transmissive electrically-conductive layer and a contact provided on the backplane.

10. A process according to claim 9 further comprising laminating a protective sheet over the front plane laminate after the front plane laminate has been laminated to the backplane.

11. A process according to claim 1 wherein the electro-optic material comprises a rotating bichromal member, electrochromic or electro-wetting material.

12. A process according to claim 1 wherein the electro-optic material comprises an electrophoretic material comprising a plurality of electrically charged particles disposed in a fluid and capable of moving through the fluid under the influence of an electric field.

13. A process according to claim 12 wherein the electrically charged particles and the fluid are confined within a plurality of capsules or microcells.

14. A process according to claim 12 wherein the electrically charged particles and the fluid are present as a plurality of discrete droplets surrounded by a continuous phase comprising a polymeric material.

15. A process according to claim 12 wherein the fluid is gaseous.

* * * * *